United States Patent [19]
Curtet et al.

[11] Patent Number: 5,648,925
[45] Date of Patent: Jul. 15, 1997

[54] OPTIMIZED OPERAND FORMATTING SAME

[75] Inventors: Joël Curtet, Fontaine; Fankwo Tsang, Grenoble, both of France

[73] Assignee: SGS-Thomson Microelectronics S.A., Saint Genis, France

[21] Appl. No.: 395,564

[22] Filed: Feb. 28, 1995

[30] Foreign Application Priority Data

Feb. 28, 1994 [FR] France ................................. 94 02283

[51] Int. Cl.$^6$ ................................................ G06F 7/52
[52] U.S. Cl. ....................... 364/284.04; 364/786.01; 327/408
[58] Field of Search ........................... 364/784, 786, 364/716; 327/407, 408, 409, 410

[56] References Cited

U.S. PATENT DOCUMENTS

| | | | |
|---|---|---|---|
| 4,592,007 | 5/1986 | Ohhashi | 364/784 |
| 4,860,235 | 8/1989 | Kondou et al. | 364/216 |
| 4,912,339 | 3/1990 | Béchude et al. | 327/410 |
| 5,012,126 | 4/1991 | Feldbaumer et al. | 327/410 |
| 5,233,233 | 8/1993 | Inoue et al. | 327/408 |
| 5,355,035 | 10/1994 | Vora et al. | 327/408 |
| 5,376,829 | 12/1994 | Rogers et al. | 327/408 |

*Primary Examiner*—David H. Malzahn
*Attorney, Agent, or Firm*—Wolf, Greenfield & Sacks, P.C.; James H. Morris

[57] ABSTRACT

A digital operand formatting stage that includes a first inverting means, a second inverting means having an input that is connected to the input of the first inverting means, and a third inverting means having an input that is connected to the output of the second inverting means, and an output that is connected to the output of the first inverting means. A first and third switching means are controlled by a first control signal and provide electrical connections between a positive voltage supply and the respective supply side of the first and third inverting means. A second and fourth switching means are controlled by a second control signal and provide electrical connections between a negative voltage supply and the respective ground sides of the first and third inverting means.

9 Claims, 6 Drawing Sheets

5,648,925

OPTIMIZED OPERAND FORMATTING SAME

BACKGROUND OF THE INVENTION

1. Field of the Invention

The invention concerns a digital operand formatting stage, and more specifically, an optimised CMOS digital operand formatting circuit for controlling the format of digital data presented to the inputs of a full adder.

2. Discussion of the Related Art

FIG. 1 illustrates a block diagram of an embodiment of a known digital operand formatting stage, which in fact is a 4-to-1 multiplexer 10; such a multiplexer 10 has an application within arithmetic logic units (ALU's), where one multiplexer 10 is used to format one digital input operand of an ALU prior to addition.

Referring to FIG. 1, the multiplexer 10 has four data input terminals, 12 to 15 inclusive, four switching input control terminals, 16 to 19 inclusive, and one data output terminal 20.

Terminal 12 carries a data input signal IN that represents a bi-state data input signal, whilst terminal 13 carries the inverse data input signal IN- of the data input signal IN carried on terminal 12. The data input signal IN- of terminal 13 can easily be generated by connecting the respective input and output terminals of an inverter I1 to terminals 12 and 13, respectively, of multiplexer 10, as illustrated.

Terminal 14 carries a fixed logic state data input signal 0. Terminal 15 carries a fixed logic state data input signal 1. Terminals 14 and 15 always have fixed, complimentary, logic state data input signals.

Terminals 16, 17, 18 and 19 carry the respective switching input control signals CS1, CS2, CS3 and CS4 inclusive. Switching control signals CS1 to CS4 inclusive are designed and controlled such that one of the signals present on terminals 12 to 15 inclusive appears on the data output terminal 20.

The data output terminal 20 carries an output data signal OUT that represents one of the four data input signals IN, IN-, 0 or 1 carried by terminals 12, 13, 14 or 15, respectively. The data output signal OUT can have the same logic state of any one of the input data signals i.e. IN, IN- , 0 or 1, depending upon the logic states of the switching input control signals CS1 to CS4 inclusive.

FIG. 2 illustrates a more detailed circuit diagram of an embodiment of multiplexer 10.

Referring to FIG. 2, multiplexer 10 comprises four buffered transmission gates 22, 24, 26 and 28 and an output inverting buffer I2.

Each of the buffered transmission gates 22, 24, 26 and 28 comprises an input inverting buffer, respectively, I3, I4, I5 and I6, and a transmission gate, respectively 30, 32, 34 and 36.

The respective input terminals 12, 13, 14 and 15 of inverter I1 and the inverting buffers I2, I3 and I4 carry the respective data input signals IN, IN- , 0 and 1.

Each of the transmission gates 30, 32, 34 and 36 comprise an n-channel transistor MN1, a p-channel transistor MP1 and an inverter I7.

The gate terminals of transistors MN1 and MP1 are respectively connected to the input and output terminals of inverter I7.

The gate terminals of transistors MN1; within the transmission gates 30, 32, 34 and 36, represent the switching input control terminals 16, 17, 18 and 19, respectively.

The respective source terminals of transistors MN1 and MP1; within each of the transmission gates 30, 32, 34 and 36, are connected together and are respectively connected to the output terminals, 38, 40, 42 and 44, of the inverting buffers I3, I4, I5 and I6, respectively.

The respective drain terminals of transistors MN1 and MP1; within the transmission gates 30, 32, 34 and 36, are connected together and are respectively connected to the input terminal 46 of the output inverting buffer I2.

The output terminal 20 of inverting buffer I2 carries the output signal OUT.

Inverters I1 to I7 inclusive, are operatively connected to a positive and negative voltage supply rail, respectively VDD and VSS (not illustrated).

Regarding the operation of the circuit illustrated in FIG. 2; only one of the switching input control signals CS1 to CS4 inclusive, will have a high logic state i.e. logic 1, at any one time, therefore only one of the transmission gates 30, 32, 34 or 36 will be able to pass a signal.

For example, assuming that the switching input control signal CS1 on terminal 16 has a high logic state; input control signals CS2, CS3 and CS4 all have low logic states, only transistor MN1 will pass the signal from the input 38 to the output 46 of transmission gate 30 when the logic state of the signal at the input 38 of the data switch is a logic low i.e. logic 0. However, if the logic state of the signal at the input 38 of transmission gate 30 is a logic high i.e. logic 1, it is transistor MP1 that will pass the signal from the input 38 to the output 46 of transmission gate 30. Therefore, the signal OUT on terminal 20 will have the same logic state as that of signal IN on terminal 12, regardless of its state. The same operational principle applies to transmission gates 32, 34 and 36.

FIG. 2. illustrates only one of several possible embodiments of a circuit that can format a digital operand.

The drawback associated with the circuit of FIG. 2, and other embodiments, is that it requires a considerable number of transistors for its implementation. If FIG. 2 is assumed to be implemented in a CMOS technology and used in conjunction with a 16-bit ALU, then 896 transistors would be required for the formatting of all the input digital operands to the ALU. It is well known that the more transistors there are in a system, the more: space is required; power is consumed; unreliable the system becomes, and the more is the design effort and time that is required.

OBJECTIVE AND SUMMARY OF THE INVENTION

An object of the invention is to allow the design of an optimised digital operand formatting circuit; particularly but not exclusively for use with a full adder, that has a reduced number of transistors compared to current digital operand formatting circuits, thereby reducing a systems overall: size; power consumption; design effort and time; and thus increasing the systems general reliability.

This object is achieved by creating a general path comprising an inverter connected in parallel with two series connected inverters and by gating the three inverters according to the operand to be set.

This object is accomplished according to the invention by a digital operand formatting stage that comprises a first inverting means having a supply side, a ground side, an input and an output; a second inverting means having a supply side, a ground side, an input that is connected to the input of said first inverting means and an output; a third inverting means having a supply side, a ground side, an input that is connected to the output of said second inverting means and an output that is connected to the output of said first inverting means; and, a general switching means for switching said first inverting means and/or said second inverting means and/or third inverting means.

This object is further accomplished according to the invention in that said general switching means comprises: a first switching means controlled by a first control signal for providing an electrical connection between a positive voltage supply and said supply side of said first inverting means; a second switching means controlled by a second control signal for providing an electrical connection between a negative voltage supply and said ground side of said first inverting means; a third switching means controlled by said second control signal for providing an electrical connection between said positive voltage supply and said supply side of said third inverting means; a fourth switching means controlled by said first control signal for providing an electrical connection between said negative voltage supply and said ground side of said third inverting stage. Further: said first, second, third and fourth switching means are controlled by a common control signal; at least one of said inverting means comprises a known CMOS inverter; said first and third switching means each comprise at least one p-channel transistor; said second and fourth switching means each comprise at least one n-channel transistor; said first, second and third inverting means each comprise a known CMOS inverter;

The object is yet further accomplished according to the invention in that: two digital operand formatting stages are controlled independently such that said digital operand formatting stages combine to form a digital operand formatting array; the output signals of said digital operand formatting array are connected to the inputs of a known full adder such that said digital operand formatting array and said full adder combine to form a digital operand formatted adder; a plurality of said digital operand formatted adders are controlled in parallel.

BRIEF DESCRIPTION OF THE DRAWINGS

An embodiment of a circuit according to the invention is described in detail below with reference to drawings among which.

DETAILED DESCRIPTION

Figure 3:
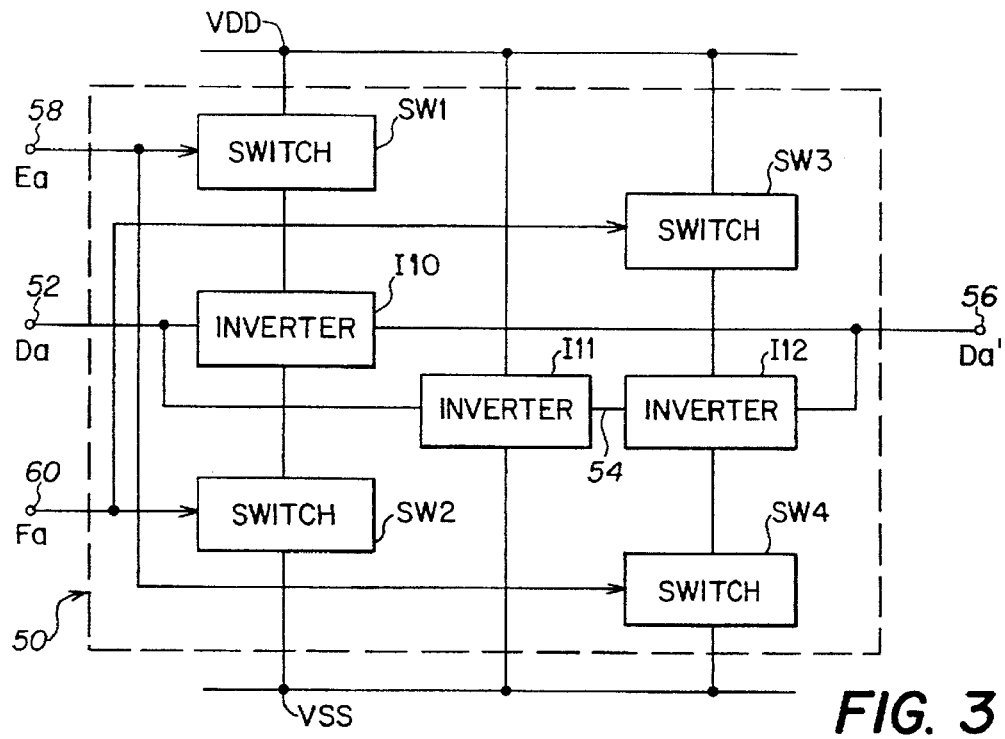
FIG. 3 illustrates a block diagram of a preferred embodiment of the invention.

FIG. 3 illustrates a block diagram of a preferred embodiment of the invention.

Referring to FIG. 3, the optimised digital operand formatting stage 50 comprises a general switching means and three inverting means, I10 to I12 inclusive. The general switching means comprises four switching means, SW1 to SW4 inclusive, each having three terminals. Inverters I10 to I12 inclusive, each have four terminals.

The respective first terminals of switches SW1 and SW3 are connected to the positive supply rail VDD.

The respective high side terminals i.e. supply sides, of inverters I10 and I12 are connected to the respective second terminals of switches SW1 and SW3.

The respective first terminals of switches SW2 and SW4 are connected to the respective low side terminals i.e. ground sides, of inverters I10 and I12.

The respective second terminals of switches SW2 and SW4 are connected to the negative supply rail VSS.

The respective high and low side terminals of inverter I11 are connected to the positive and negative supply rails, respectively VDD and VSS.

The input terminal 52 of the digital operand formatting stage 50 is connected to the input terminals of inverters I10 and I11 and carries the data input signal Da.

The input terminal 54 of inverter I12 is connected to the output terminal of inverter I11.

The output terminals of inverters I10 and I12 are connected together and form the output terminal 56 of the digital operand formatting stage 50, which carries the data output signal Da'.

The operand formatting stage has two switching input control terminals 58,60, which carry the switching control signals Ea and Fa.

Switches SW1 and SW4 are both controlled, via their respective third terminals, by the switching control signal Ea and switches SW2 and SW3 are controlled, via their respective third terminals, by the switching control signal Fa.

Figure 4:
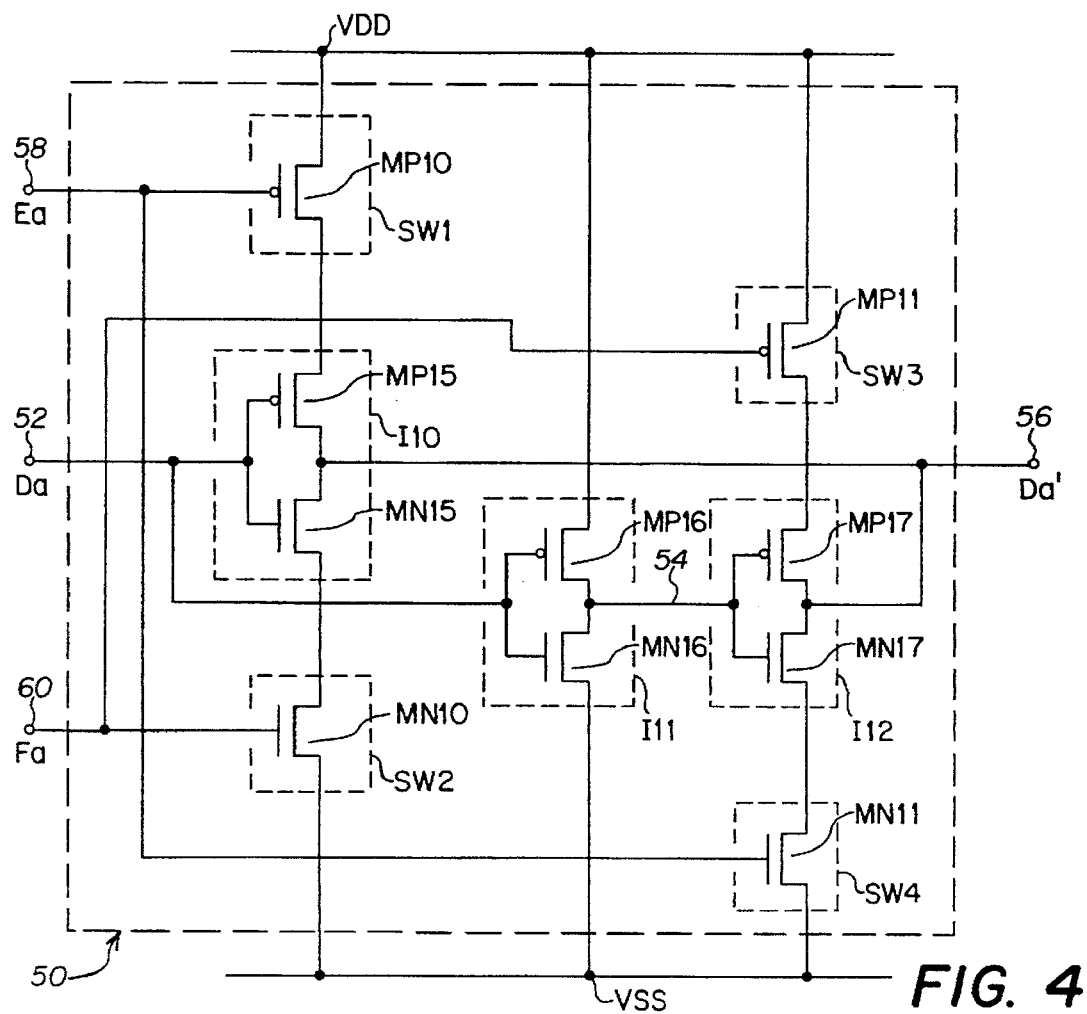
FIG. 4 illustrates a detailed circuit diagram of FIG. 3.

FIG. 4 illustrates a detailed circuit diagram of FIG. 3.

Referring to FIG. 4, switches SW1 and SW3 are implemented using p-channel MOS transistors, respectively MP10 and MP11. The source terminals of transistors MP10 and MP11 are connected to the positive supply rail VDD, whilst their respective drain terminals are connected to the respective high sides of inverters I10 and I2.

Switches SW2 and SW4 are implemented using n-channel MOS transistors, respectively MN10 and MN11. The source terminals of transistors MN10 and MN11 are connected to the negative supply rail VSS, whilst their respective drain terminals are connected to the respective low sides of inverters I10 and I12.

The gate terminals 58 of transistors MP10 and MN11 are controlled by the switching control signal Ea, whilst the gate terminals 60 of transistors MP11 and MN10 are controlled by the switching control signal Fa.

Inverters I10 to I12 inclusive, are each implemented with a known CMOS inverter connected in a known operational manner.

Inverter I10 comprises a p-channel transistor MP15 and an n-channel transistor MN15.

Inverter I11 comprises a p-channel transistor MP16 and an n-channel transistor MN16.

Inverter I12 comprises a p-channel transistor MP17 and an n-channel transistor MN17.

Table 1. illustrates the truth table of the operation of the circuit illustrated in FIG. 4, where X donates a 'don't care' state.

TABLE 1

| Da | Ea | Fa | Da' |
|----|----|----|-----|
| X  | 0  | 0  | 1   |
| 0  | 0  | 1  | 1   |
| 1  | 0  | 1  | 0   |
| 0  | 1  | 0  | 0   |
| 1  | 1  | 0  | 1   |
| X  | 1  | 1  | 0   |

Referring back to FIG. 4.

When the switching control signals Ea and Fa both have a logic 0 state, the data output signal Da' is always a logic 1 state regardless of the logic state of the data input signal Da, the reason being that:

inverter I10 can only source current to its output terminal 56 when its input terminal 52 has a logic 0 state, and cannot sink current from its output 56 when its input 52 has a logic 1 state; and inverter I12 can only source current to its output terminal 56 when its input terminal 54 has a logic 0 state, and cannot sink current from its output 56 when its input 54 has a logic 1 state, since;

transistors MP10 and MP11 are turned on and transistors MN10 and MN11 are turned off.

Therefore: when the data input signal Da, on terminal 52, has a logic 0 state, terminal 54 has a logic 1 state, and the data output signal Da' is pulled up to a logic 1 state i.e. approximately VDD, via transistors MP10 and MP15; when the data input signal Da, on terminal 52, has a logic 1 state, terminal 54 has a logic 0 state, and the data output signal Da' is pulled up to a logic 1 state via transistors MP11 and MP17.

When the switching control signals Ea and Fa both have a logic 1 state, the data output signal Da' is always a logic 0 state regardless of the logic state of the data input signal Da, the reason being that:

inverter I10 can only sink current from its output terminal 56 when its input terminal 52 has a logic 1 state, and cannot source current to its output 56 when its input 52 has a logic 0 state; and inverter I12 can only sink current from its output terminal 56 when its input terminal 54 has a logic 1 state, and cannot source current to its output 56 when its input 54 has a logic 0 state, since;

transistors MP10 and MP11 are turned off and transistors MN10 and MN11 are turned on.

Therefore: when the data input signal Da, on terminal 52, has a logic 1 state, terminal 54 has a logic 0 state, and the data output signal Da' is pulled down to a logic 0 state i.e. approximately VSS, via transistors MN10 and MN15; when the data input signal Da, on terminal 52, has a logic 0 state, terminal 54 has a logic 1 state, and the data output signal Da' is pulled down to a logic 0 state via transistors MN11 and MN17.

When the switching control signal Ea has a logic 1 state and the switching control signal Fa has a logic 0 state, the data input and output signals, respectively Da and Da', of the digital operand formatting stage 50, always have the same logic states, regardless of the state of the data input signal Da, the reason being that:

inverter I10 can neither source nor sink current to nor from its output terminal 56 regardless of its input terminal 52 logic state; and inverter I12 can either source or sink current to or from its output terminal 56 depending upon its input terminal 54 logic state; since;

transistors MP10 and MN10 are turned off and transistors MP11 and MN11 are turned on.

Therefore: when the data input signal Da, on terminal 52, has a logic 0 state, terminal 54 has a logic 1 state, and the data output signal Da' is pulled down to a logic 0 state via transistors MN11 and MN17; when the data input signal Da, on terminal 52, has a logic 1 state, terminal 54 has a logic 0 state, and the data output signal Da' is pulled up to a logic 1 state via transistors MP11 and MP17.

When the switching control signal Ea has a logic 0 state and the switching control signal Fa has a logic 1 state, the data input and output signals, respectively Da and Da', of the operand formatting stage 50, always have inverse logic states, regardless of the state of the input signal Da, the reason being that:

inverter I10 can either source or sink current to or from its output terminal 56 depending upon its input terminal 52 logic state; and inverter I12 can neither source nor sink current to nor from its output terminal 56 regardless of its input terminal 54 logic state, since;

transistors MP10 and MN10 are turned on and transistors MP11 and MN11 are turned off.

Therefore: when the data input signal Da, on terminal 52, has a logic 0 state, terminal 54 has a logic 1 state, and the data output signal Da' is pulled up to a logic 1 state via transistors MP10 and MP15; when the data input signal Da, on terminal 52, has a logic 1 state, terminal 54 has a logic 0 state, and the data output signal Da' is pulled down to a logic 0 state via transistors MN10 and MN15.

Figure 5:
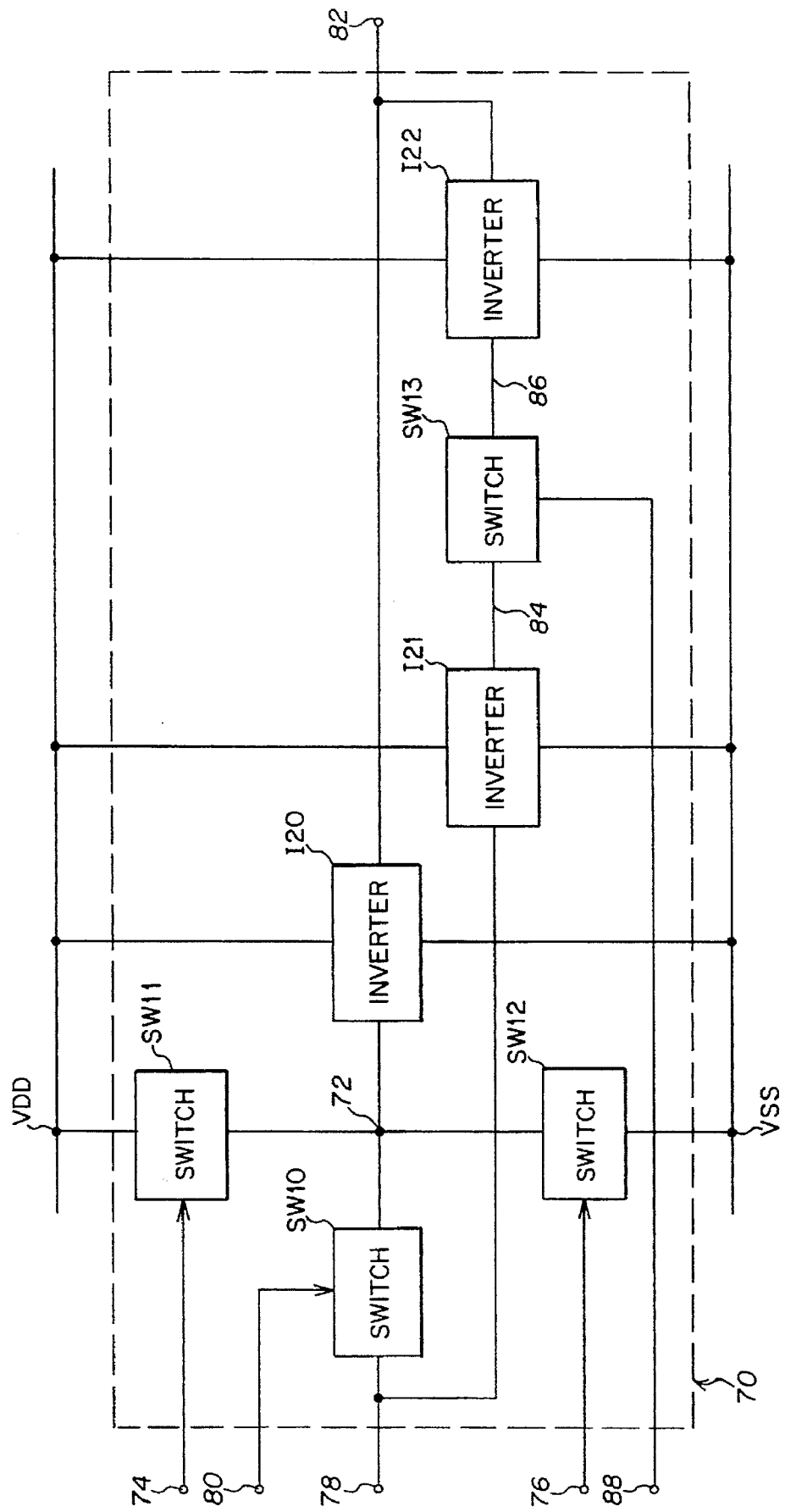
FIG. 5 illustrates a block diagram of another embodiment of the invention.

FIG. 5 illustrates a block diagram of another embodiment of the invention.

Referring to FIG. 5, the digital operand formatting stage 70 comprises a general switching means and three inverting means, 120 to 122 inclusive. The general switching means comprises four switching means, SW10 to SW13 inclusive, each having three terminals. Inverters 120 to 122 inclusive, each have four terminals.

The first terminal of switch SW11 is connected to the positive supply rail VDD, whilst its second terminal 72 is connected to the first terminal of switch SW12, whose second terminal is connected to the negative supply rail VSS. The respective third terminals 74,76 of switches SW11 and SW12 carry their respective switching control signals.

The first terminal of switch SW10 constitutes the data input terminal 78 of the digital operand formatting stage 70. The second terminal of switch SW10 is connected to the second and first terminals of switches SW11 and SW12, respectively. The third terminal 80 of switch SW10 carries its switching control signal.

The respective high side terminals of inverters 120 to 122 inclusive, are connected to the positive supply rail VDD, whilst their respective low side terminals are connected to the negative supply rail VSS.

Terminal 72 of switches SW10 to SW12 inclusive, is connected to the input terminal of inverter 120, whose output terminal constitutes the data output terminal 82 of the digital operand formatting stage 70.

The input terminal of inverter 121 is connected to the data input terminal 78 of the digital operand formatting stage 70.

The first terminal of switch SW13 is connected to the output terminal 84 of inverter 121.

The input terminal of inverter 122 is connected to the second terminal 86 of switch SW13.

The third terminal 88 of of switch SW13 carries its switching control signal.

The output terminal of inverter 122 is connected to the output terminal 82 of the digital operand formatting stage 70 i.e. the output of inverter 120.

Figure 1:
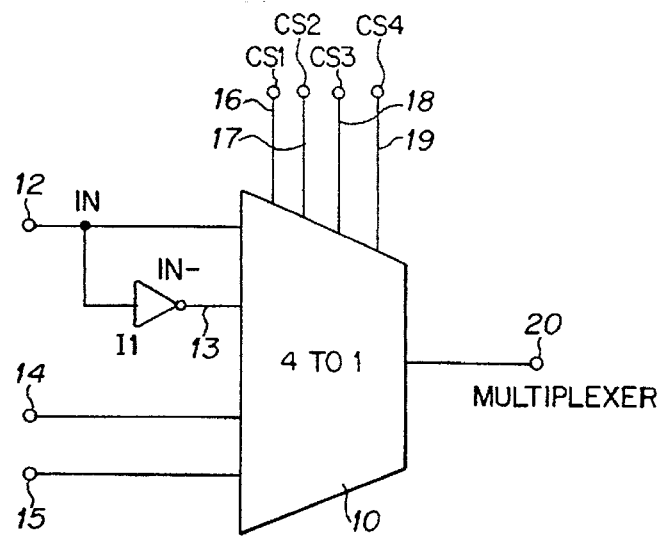
FIG. 1 illustrates a conventional 4-to-1 multiplexer.
Figure 2:
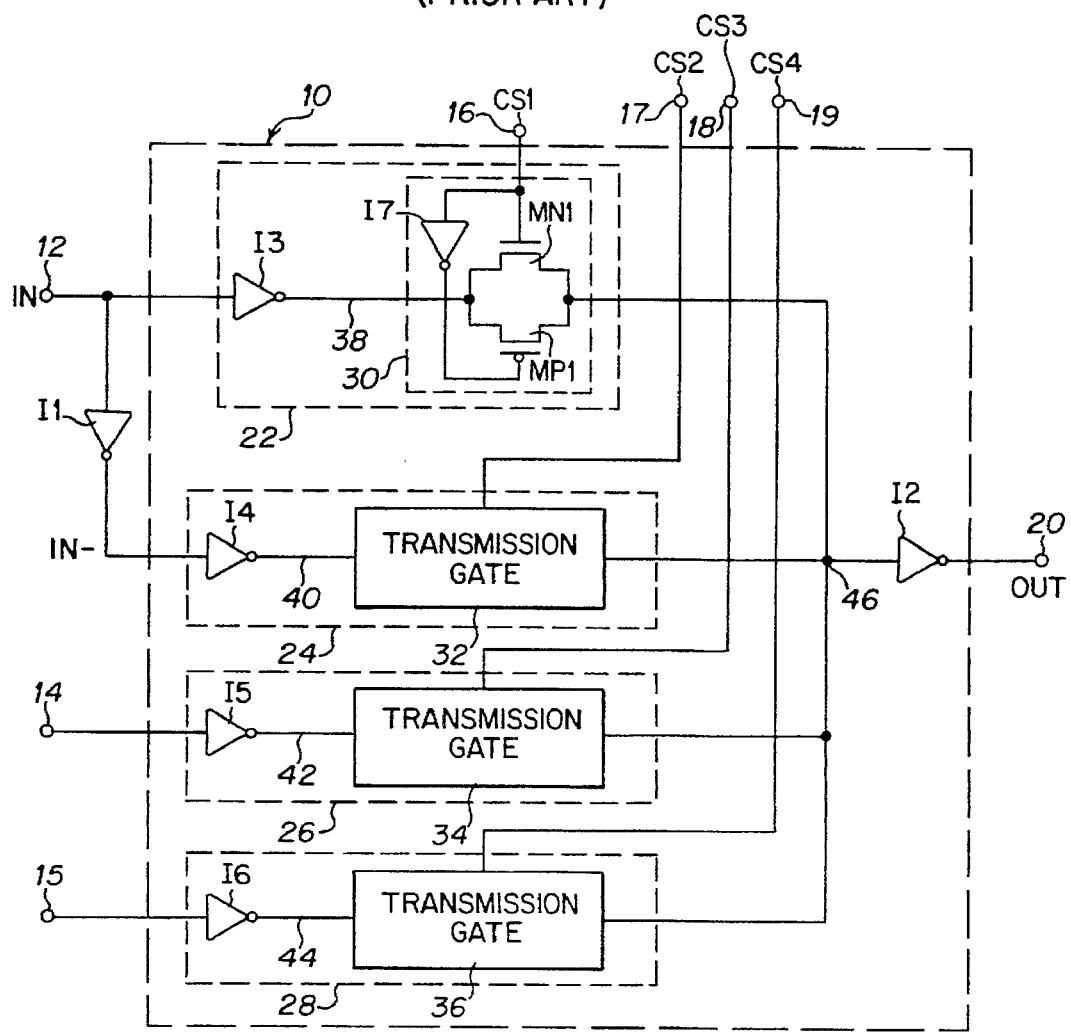
FIG. 2 illustrates a more detailed circuit diagram of FIG. 1.

Within the operand formatting circuit 70 of FIG. 5, all the inverters and switches except switches SW10 and SW13 can be implemented as illustrated in FIG. 4. Switches SW10 and SW13 need to be implemented using a transmission gate (30) type structure that is the same as, or operationally the same as, that illustrated in FIG. 2.

The control of switches SW10 to SW13 inclusive, has to be such that the truth table of Table 1. is met.

Figure 6:
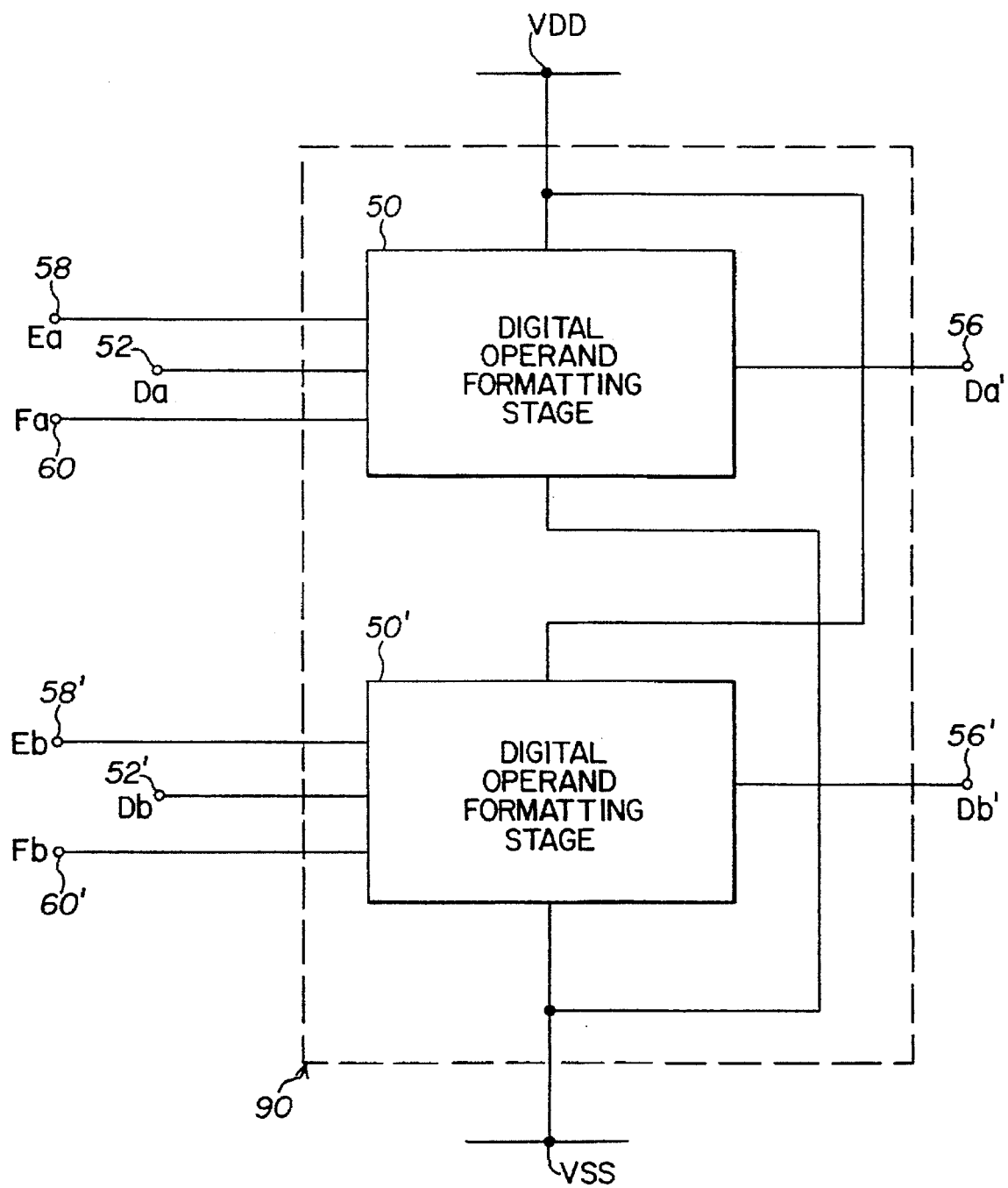
FIG. 6 illustrates a block diagram of a digital operand formatting array.

FIG. 6 illustrates a block diagram of two digital operand formatting stages 50,50' of the type shown in FIG. 4, which operate independently. The combination of the two operand formatting stages 50,50' will hereby be referred to as a digital operand formatting array 90. Note that, so as to avoid confusion, the input terminals and signals and the output terminals and signals of the operand formatting stages 50,50' have different suffix to each other i.e. Db, Db', Eb, Fb, 52', 56', 58' and 60'.

Figure 7:
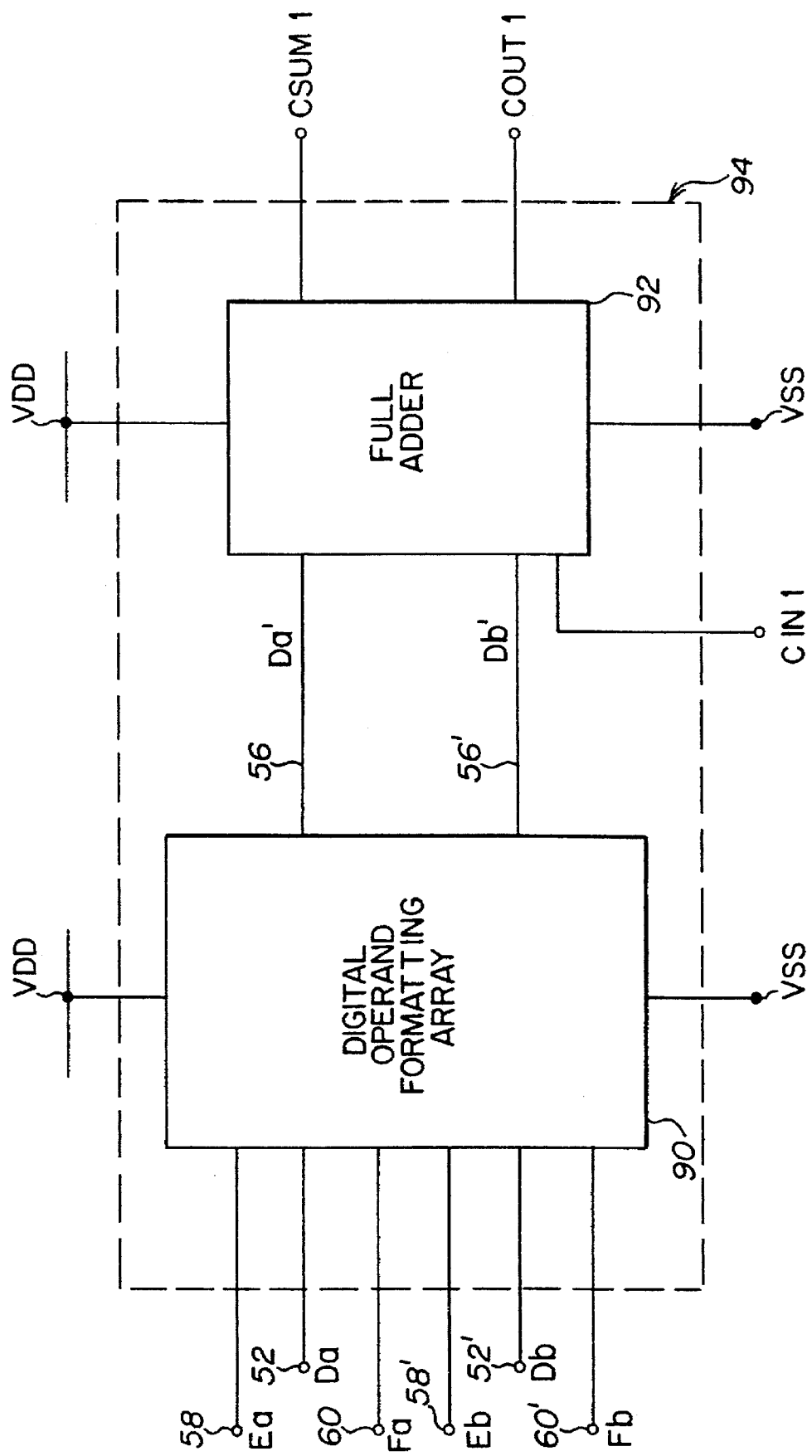
FIG. 7 illustrates a block diagram of a digital operand formatting array connected to a full adder; and, FIG. 8 illustrates a block diagram of a plurality of operand formatting adders.

FIG. 7 illustrates a block diagram of a digital operand formatting array connected to a known full adder 92.

Referring to FIG. 7, the respective outputs 56,56' of the digital operand formatting array 90 are connected to the inputs of the full adder 92, which has one further input CIN and two outputs SUM and COUT and is operatively connected between the positive and negative supply rails, respectively VDD and VSS. The combination of the digital operand formatting array 90 and the full adder 92 will hereby be referred to as a digital operand formatted adder 94.

Figure 8:
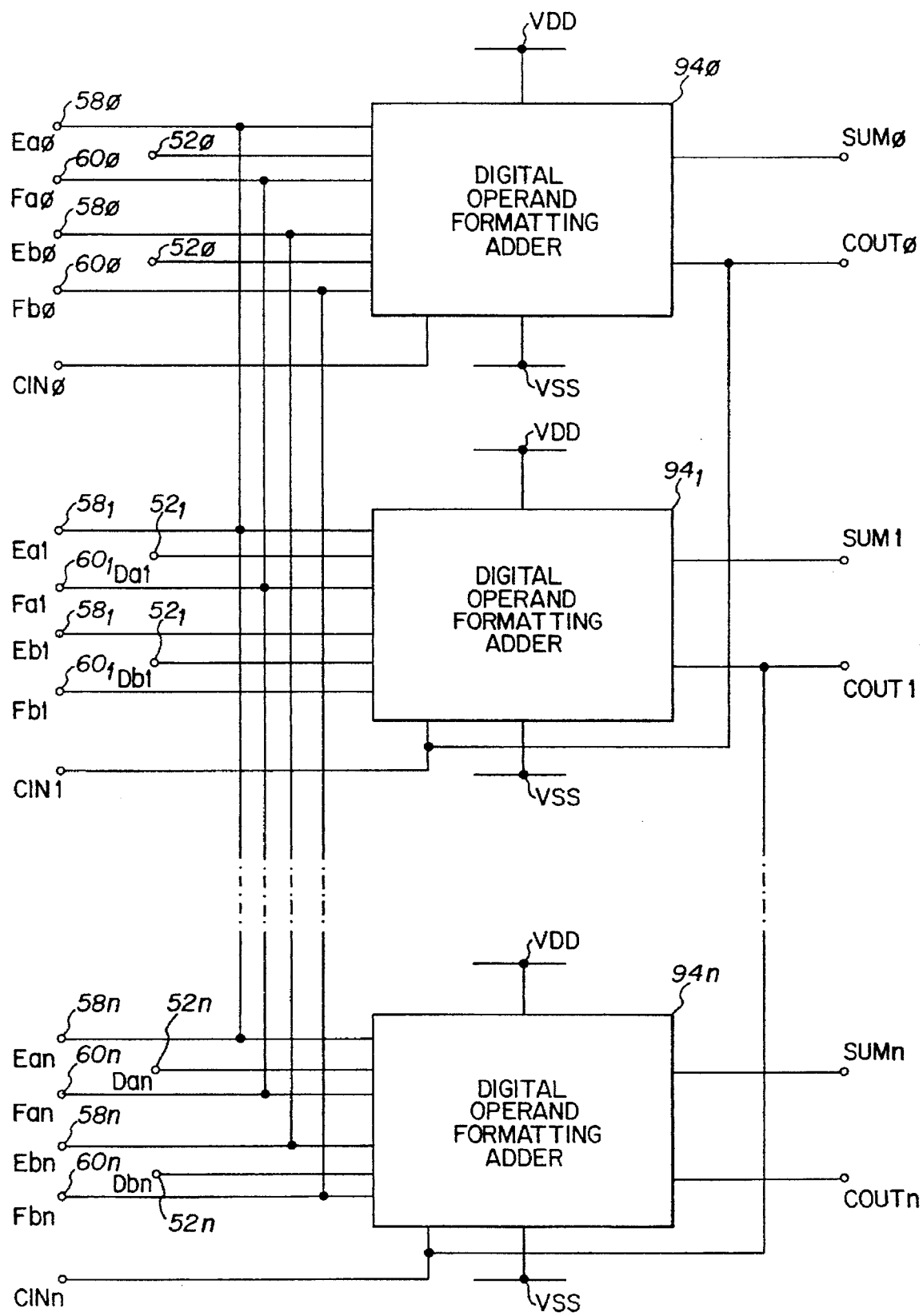

FIG. 8 illustrates a block diagram of a plurality of digital operand formatted adders 94.

Referring to FIG. 8, note that an additional suffix for each of the inputs and outputs of n+1 digital operand formatted adders, starting at zero (0) and ending at an undefined number n; where n is an integer that is greater than 1, has been included. The respective switching input control signals Eax, Fax, Ebx and Fbx; where x denotes each of the suffix integers between zero and n, are all respectively connected and hence controlled together. Note also that the respective outputs COUTx of each of the respective digital operand formatted adders 94x are connected to the respective inputs CINx+1 of each successive digital operand formatted adder 94x.

By formatting the data inputs Dax and Dbx, of the digital operand formatted adders 94x, using the control signals Ea, Fa, Eb and Fb, all the full adders can be made to perform, other than their normal addition operation, subtraction, reversed subtraction, equal Dax or equal Dbx, negate Dax or negate Dbx, increment Dax or increment Dbx, decrement Dax or decrement Dbx.

The essence of the invention should now be apparent and in fact, the number of transistors, based on the circuit of FIG. 4, that are required for formatting the data inputs to a 16-bit ALU is 320. Therefore, a considerable saving (896–320= 576) in the required number of transistors is made, to say nothing of space and power consumption. Also, the circuit diagram of FIG. 4 lends itself to creating a neat compact cell for layout purposes of an IC that incorporates a multibit ALU for example.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A digital operand formatting stage comprising:

a first inverting means having a supply side, a ground side, an input and an output;

a second inverting means having a supply side, a ground side, an input connected to the input of said first inverting means, and an output;

a third inverting means having a supply side, a ground side, an input that is connected to the output of said second inverting means and an output that is connected to the output of said first inverting means; and, a general switching means for switching at least one of said first inverting means, said second inverting means and said third inverting means.

2. A digital operand formatting stage according to claim 1, wherein said general switching means comprises:

a first switching means that is controlled by a first control signal for providing an electrical connection between a positive voltage supply and said supply side of said first inverting means;

a second switching means that is controlled by a second control signal for providing an electrical connection between a negative voltage supply and said ground side of said first inverting means; and a third switching means that is controlled by said second control signal for providing an electrical connection between said positive voltage supply and said supply side of said third inverting means;

a fourth switching means that is controlled by said first control signal for providing an electrical connection between said negative voltage supply and said ground side of said third inverting means.

3. A digital operand formatting stage according to claim 2, wherein at least one of said inverting means comprises a known CMOS inverter.

4. A digital operand formatting stage according to claim 2, wherein said first and third switching means each comprise at least one p-channel transistor.

5. A digital operand formatting stage according to claim 2, wherein said second and fourth switching means each comprise at least one n-channel transistor.

6. A digital operand formatting stage according to claim 2, wherein:

said first inverting means comprises a known CMOS inverter;

said second inverting means comprises a known CMOS inverter;

said third inverting means comprises a known CMOS inverter;

said first switching means comprises at least one p-channel transistor;

said second switching means comprises at least one n-channel transistor;

said third switching means comprises at least one p-channel transistor; and said fourth switching means comprises at least one n-channel transistor.

7. A digital formatting array comprising a plurality of digital operand formatting stages, each comprising:

a first inverting means having a supply side, a ground side, an input and an output;

a second inverting means having a supply side, a ground side, an input connected to the input of said first inverting means, and an output;

a third inverting means having a supply side, a ground side, an input that is connected to the output of said second inverting means and an output that is connected to the output of said first inverting means to form an output of the digital operand formatting stage; and a switching means for switching at least one of said first inverting means, said second inverting means and said third inverting means, wherein said plurality of digital operand formatting stages are controlled independently of each other.

8. A digital operand formatting array according to claim 7 wherein the outputs of each of the plurality of digital operand formatting stages are connected to addend and augend inputs of a full adder such that said digital operand formatting array and said full adder together form a digital operand formatted adder.

9. A digital operand formatting array according to claim 7, wherein said switching means of each digital operand formatting stage comprises:

a first switching means, controlled by a first control signal, for providing an electrical connection between a positive voltage supply and said supply side of said first inverting means;

a second switching means, controlled by a second control signal, for providing an electrical connection between a negative voltage supply and said ground side of said first inverting means;

a third switching means, controlled by said second control signal, for providing an electrical connection between said positive voltage supply and said supply side of said third inverting means; and a fourth switching means, controlled by said first control signal, for providing an electrical connection between said negative voltage supply and said ground side of said third inverting means, wherein the inputs of said first, second, third, and fourth switching means of each digital operand are connected in parallel with other inputs of another digital operand formatting stage of another formatting array of the same kind.

* * * * *

UNITED STATES PATENT AND TRADEMARK OFFICE
CERTIFICATE OF CORRECTION

PATENT NO. : 5,648,925
DATED      : July 15, 1997
INVENTOR(S) : Joel Curtet and Fan Kwo Tsang It is certified that error appears in the above-indentified patent and that said Letters Patent is hereby corrected as shown below:

On the title page: Item [54] and Column 1, line 1, should read
-- OPTIMISED OPERAND FORMATTING STAGE --.

Signed and Sealed this

Fourteenth Day of October, 1997

Attest:

BRUCE LEHMAN

Attesting Officer

Commissioner of Patents and Trademarks